United States Patent [19]

Tucker

[11] Patent Number: 4,837,561
[45] Date of Patent: Jun. 6, 1989

[54] METHOD AND APPARATUS FOR THE GENERATION OF MIXED REFRESH AND ROLL MODE DISPLAY IN A CRT

[75] Inventor: Brian D. Tucker, Ilford, England

[73] Assignee: Gould Electronics Limited, Hainault, England

[21] Appl. No.: 70,471

[22] Filed: Jul. 7, 1987

[30] Foreign Application Priority Data

Jul. 8, 1986 [GB] United Kingdom ............... 8616588

[51] Int. Cl.⁴ .............................................. G09G 1/06
[52] U.S. Cl. .................................. 340/722; 324/112; 324/121 R; 364/487
[58] Field of Search .................. 340/722, 726, 734; 324/112, 121; 364/487

[56] References Cited

U.S. PATENT DOCUMENTS

| | | | |
|---|---|---|---|
| 3,406,387 | 10/1968 | Werme | 340/722 |
| 3,653,027 | 3/1972 | Scheer | 340/726 |
| 3,818,474 | 6/1974 | Kurner et al. | 340/734 |
| 3,836,851 | 9/1974 | Schumann | 324/112 |
| 4,251,814 | 2/1981 | Dagostino | 340/722 |
| 4,251,815 | 2/1981 | Dagostino | 340/722 |
| 4,346,333 | 8/1982 | Dagostino | 340/722 |
| 4,470,043 | 9/1984 | Sorensen et al. | 340/722 |
| 4,644,337 | 2/1987 | Shank et al. | 340/722 |
| 4,647,862 | 3/1987 | Blair | 364/487 |

Primary Examiner—Gerald L. Brigance
Assistant Examiner—Richard Hjerpe

[57] ABSTRACT

According to a method and apparatus for displaying data on a display screen, such as the screen of a digital storage oscilloscope, in a ROLL mode and prior to a trigger event, newly acquired data is continuously newly displayed at a given point on the screen as the oldest displayed data is rolled off the screen at a first side. This is continued even during a REFRESH mode until a trigger event occurs, at which time the displayed data is frozen on the screen and newly acquired data is written across the screen toward a second side of the screen, so that at the time the newly acquired data is written to the second end of the screen, data is observable which represents a certain period before the trigger event and after the trigger event.

6 Claims, 3 Drawing Sheets

METHOD AND APPARATUS FOR THE GENERATION OF MIXED REFRESH AND ROLL MODE DISPLAY IN A CRT

BACKGROUND OF THE INVENTION

This invention relates to graphics displays, in particular though not exclusively digital storage oscilloscopes.

Digital storage oscilloscopes have two display modes, usually referred to as REFRESH and ROLL display modes. The REFRESH mode display is used in conjunction with trigger operations in which the display is triggered by a predetermined event from an internal or external source. Problems have arisen in the REFRESH mode of operation with low time base rates in that the periods required for display of operation following a trigger event are excessive.

In order to explain this problem, reference will first be made to FIGS. 1 and 2 which are block diagrams of parts of a digital storage oscilloscope relevant to the ROLL mode and REFRESH mode, respectively. Referring firstly to FIG. 1 which shows the parts of a system relevant to the ROLL mode, an acquisition system 2 is provided for gathering information from a source to be examined and providing this information in digital form to an acquisition buffer 4 where it is temporarily stored before storing in a display store 6 at an appropriate position. Display store 6 is controlled by an addressing system comprising a write counter 8, a display counter 10, an adder 12 and an address multiplexer store 14. The display store 6 supplies information to a buffer 16 from whence the information is fed to the display system 18. Thus in operation, a multiplexing operation occurs so that data is written into the display store 6 from the acquisition buffer 4 under the control of write counter 8 and at the same time information is fed to the display buffer 16 for display by the display system 18 under the control of display counter 10. Display counter 10 in addition determines the position on the X coodinate of the cathode ray screen of the current bit of information to be displayed. Thus the display counter 10 provides the X address for the display system, sweeping the display from left to right with increasing count. By adding the current value of the write counter 8 to the display counter 10 to generate the address of the data for display, the ROLL mode is achieved. In the ROLL mode the newest data received from the acquisition buffer 4 is displayed on the righthand side of the screen whereas the oldest information in the display buffer 10 is lost on the lefthand side of the screen. Thus the buffer will roll from right to left as new data is entered from the acquisition system 2.

Referring now to FIG. 2 the parts of the system relevant to the REFRESH mode are shown. Similar or corresponding parts to those shown in FIG. 1 are indicated by the same reference numeral. It will be noted two buffers are provided, a post-trigger acquisition buffer 20 and a pre-trigger acquisition buffer 22 with a transfer buffer 24 connected therebetween. These buffers supply a pre-trigger store 26 which is controlled by a pre-trigger counter 28 which addresses the store 26. In operation, when the digital storage oscilloscope is switched to a trigger mode of operation it is necessary to collect two sets of information, namely information relating to a period or cycle immediately before the trigger event in pre-trigger buffer 22 and then information relating to a period or cycle immediately after the trigger in a post-trigger buffer 20. In a REFRESH mode the display remains static until the first trigger following a memory flushing period. During this so-called memory flushing period information is gathered from the period or cycle preceding the trigger and the trigger mode of operation is disabled until there is sufficient data within the pre-trigger store 26 to provide a display on display system 18. Thus in operation information is firstly stored in buffer 22 and then transferred to pre-trigger store 26 under the control of pre-trigger counter 28. When the pre-trigger data has been acquired and a trigger event occurs, information is transferred via transfer buffer 24 from pre-trigger store 26 to display store 6 under the control of a transfer counter 30. This information is displayed in system 18 under the control of display counter 10 and at the same time information from acquisition system 2 is entered into post-trigger buffer 20 and thence into display store 6 under the control of write counter 8. Thus a three-way multiplexing system is set up to permit display of the pre-trigger information whilst gathering post-trigger information. Thus once the post-trigger information has been acquired, it is then subsequently displayed in display system 18.

The problem with this arrangement is that in the REFRESH mode the time taken to fill pre-trigger buffer 22 with a cycle or period of information can be excessive at very low time base rates. For example 50% pre-trigger at 10 seconds per centimetre will require a 50 second period in which buffer store 22 is filled and a trigger event occurs before the display can be updated. During this period the operator cannot observe any activity and this is clearly a disadvantage in terms of being an inconvenience to the operator.

SUMMARY OF THE INVENTION

With a view to reducing this problem, the present invention provides a method of displaying information on a display screen in which data is displayed on either side of a trigger point wherein prior to a trigger event new data is displayed as it is acquired and old data is rolled to one end of the display screen and after the trigger event the display becomes static to display, on either side of the trigger point, data acquired before and after the trigger event. Thus during the memory flush period in which information is gathered for a period or cycle of operation prior to a trigger event, the information gathered is employed to roll the display so that the operator is continuously made aware of the current information entering via the acquisition system. Preferably, trigger events occurring during the memory flushing period are ignored and when the memory flushing period has expired and sufficient information has been gathered concerning the pre-trigger cycle or period of operation, the next trigger event is a valid trigger event and information is then gathered concerning a post-trigger cycle or period of operation and this information is employed to be written directly to the display store so that the display store contains both information relating to the pre-trigger condition of the system from which data is acquired and information concerning the post-trigger condition of the system from which information is acquired.

Thus for example in accordance with the invention with 50% pre-trigger, by which is meant the trigger event occurs at a centre point in the screen of the display, when the system enters the REFRESH mode of operation, information is gathered concerning a pre-trigger period. Whilst this information is gathered the display is rolled in known manner, preferably from the trigger point on the display so that the new information is displayed on the screen as and when it is acquired at the trigger point and old information is lost from the end of the screen. When a pre-trigger period of information has been gathered, following the next valid trigger event, information is gathered regarding a post-trigger cycle of the information and this is written into the display store and displayed in the opposite direction on the screen from the trigger point. When the post-trigger information is displayed, the pre-trigger information is also displayed on the other side of the trigger point but at that stage remains static.

The present invention also provides apparatus for displaying information comprising a display screen, an acquisition system for acquiring information for display on the screen, a memory store for storing information from the acquisition system for display on the screen and address means coupled to the display screen and the memory store for causing information from the memory store to be displayed on the screen, the apparatus being arranged such that prior to a trigger event new data is displayed as it is acquired and the display is rolled to one end of the display screen and after the trigger event the display becomes static to display, on either side of a trigger point, data acquired before and after the trigger event.

Preferably the apparatus comprises a pre-trigger acquisition buffer for receiving information acquired prior to the trigger event, a post-trigger acquisition buffer for receiving information acquired after the trigger event, both buffers being connected to the memory store, and trigger control means which enable the post-trigger acquisition buffer and disable the pre-trigger acquisition buffer in response to a trigger signal generated by the trigger event. The operation of the trigger control means is preferably inhibited until the pre-trigger acquisition buffer has acquired a predetermined amount of information.

Thus in accordance with the invention the operator is made continuously aware of information as it is gathered by the acquisition system when the REFRESH mode of operation is entered and there is not an unreasonable delay before information acquired is displayed to the operator.

BRIEF DESCRIPTION OF THE DRAWINGS

A preferred embodiment of the invention will now be described with reference to the accompanying drawings wherein.

DESCRIPTION OF THE PREFERRED EMBODIMENT

Figure 1:
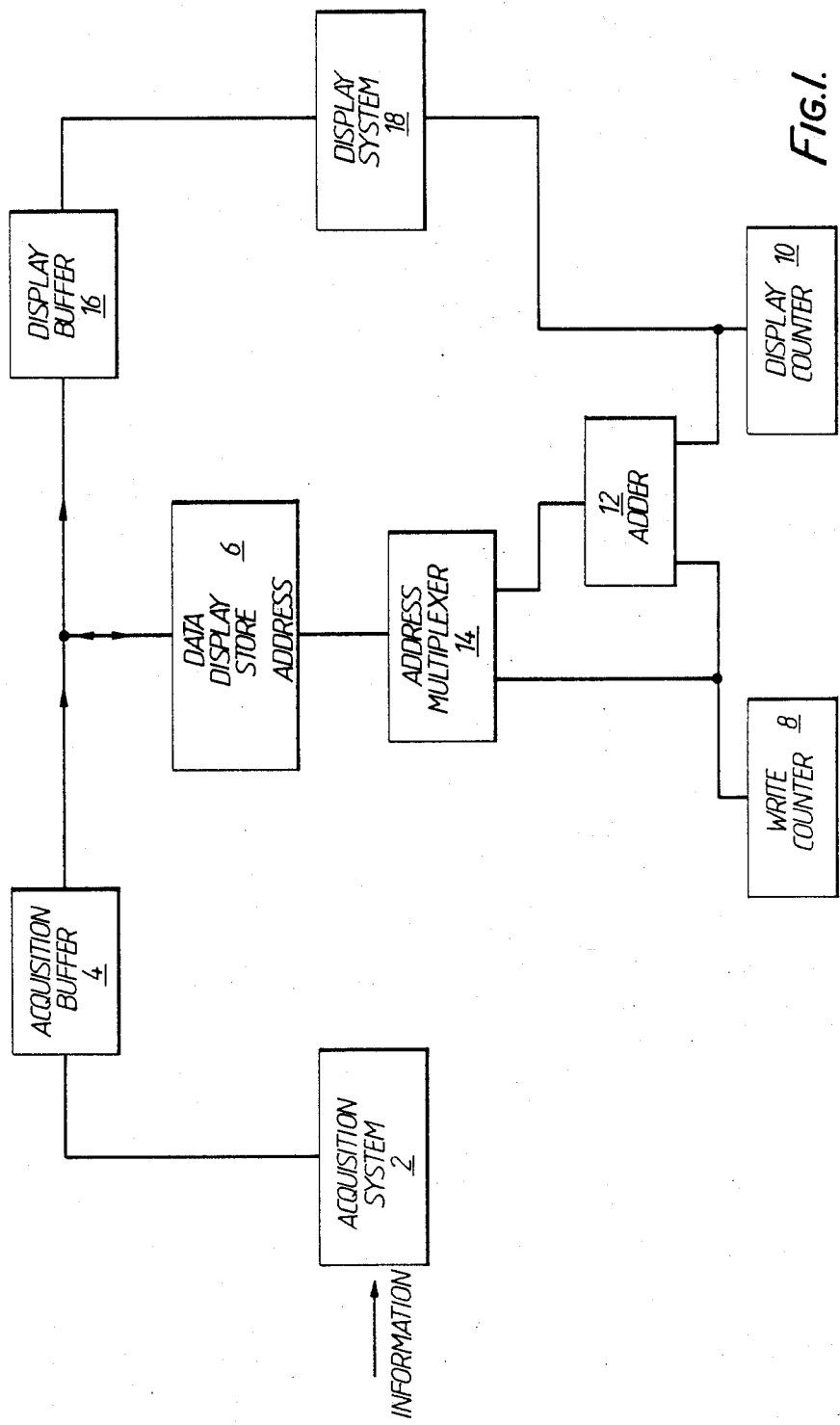
FIG. 1 is a block diagram of part of a digital storage oscilloscope system relating to a ROLL mode of operation.
Figure 2:
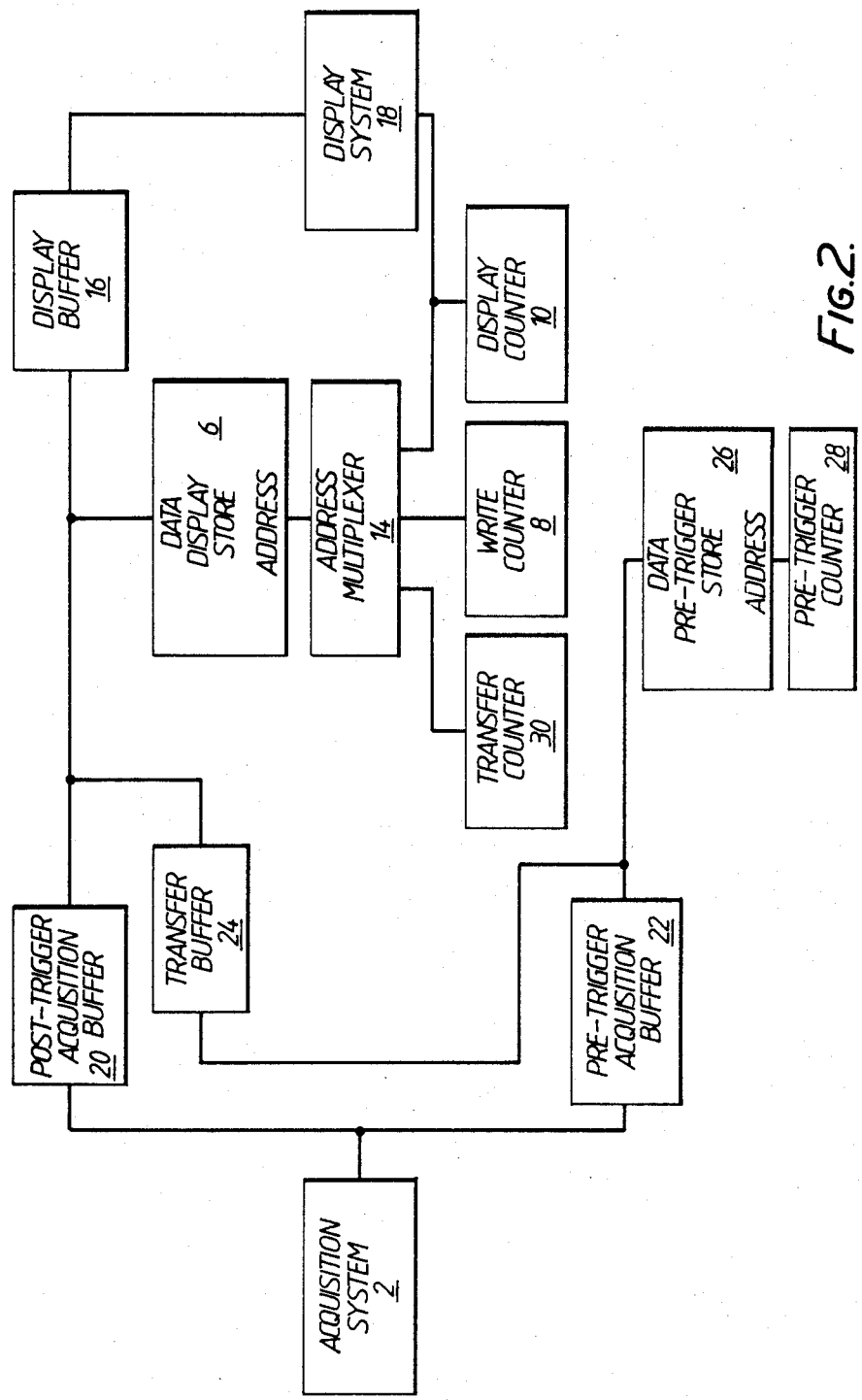
FIG. 2 is a block diagram of part of a digital storage oscilloscope system relating to a REFRESH mode of operation.

Referring to the drawings FIGS. 1 and 2 have been described above and reference will now be made to FIG. 3 which is a preferred embodiment of the invention. Similar or corresponding parts to those of FIGS. 1 and 2 are identified by the same reference numeral.

Figure 3:
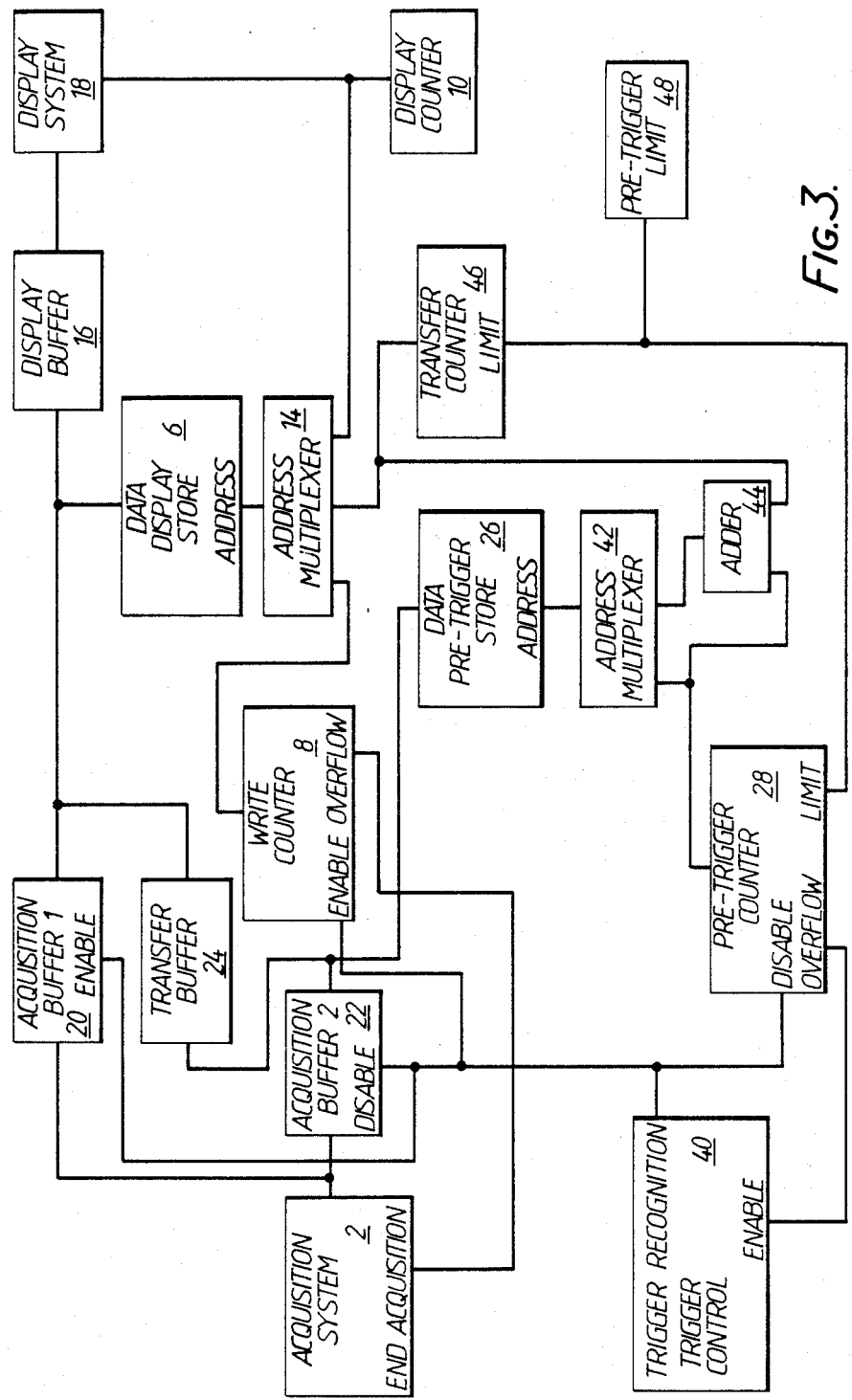
FIG. 3 is a block diagram of part of a digital storage oscilloscope system relating to a REFRESH mode of operation but incorporating the present invention.

In FIG. 3 a trigger control 40 is provided responsive to an overflow signal from pre-trigger counter 28 and providing a trigger recognition signal to buffer 22 and buffer 20. Pre-trigger counter 28 is connected to pre-trigger store 26 via an address multiplexer 42 which is coupled to an adder 44 which receives inputs from counter 28 and a transfer counter 46. A pre-trigger limit control 48 is provided.

In operation of the system shown in FIG. 3 when the REFRESH mode of operation is entered data is stored in acquisition buffer 22 for a pre-trigger cycle or period known as the memory flush period. Pre-trigger counter 28 is set to zero and transfer counter 46 is set to zero. Trigger control 40 is set to ignore trigger events. The absence of a trigger recognition signal from control 40 disables acquisition buffer 20 and enables acquisition buffer 20 so that information acquired is entered into acquisition buffer 22 and thence into pre-trigger store 26. As information is entered into pre-trigger store 26 it is transferred to display store 6 via transfer buffer 24 and is thence displayed from store 6 in display system 18. Thus by means of address multiplexer 14, a multiplexing system is set up with access to the display store 6 for display counter 10 (which enables display of the display system 18), transfer counter 46, which enables data to be transferred from pre-trigger store 26 into display store 6 via buffer 24, and write counter 8. Simultaneously data acquired in acquisition buffer 22 is written into pre-trigger store 26 under the control of pre-trigger counter 28 via address multiplexer 42 and data is transferred from pre-trigger store 26 to transfer buffer 24 under the control of transfer counter 46. Adder 44 ensures that the oldest data in pre-trigger store 26 is transferred first to buffer 24 and thence to display 6, thereby ensuring a ROLL effect in the display store. Pre-trigger limit 48 ensures that the ROLL effect is constrained to the pre-trigger period of information acquisition which expires at the reset of pre-trigger counter 28. The overflow signal from counter 28 enables trigger control 40 so that the next valid trigger signal received enables write counter 8 and buffer 20 while disabling the pre-trigger counter 28 and buffer 22. Data acquired by system 2 is then written into buffer 20 and thence into display store 6 under the control of write counter 8. At the same time this information is displayed under the control of display counter 10. The write counter 8 is preset to the address of the trigger point in the display store 6 so that post trigger information gathered from buffer 20 is written to a post trigger section of the store 6. The information acquisition cycle ceases when an overflow signal is obtained from write counter 8. Thus in this condition there is in display store 6 information representing a post trigger cycle or period and the immediate preceding cycle or period preceding the trigger point. Both sets of information are displayed on the display screen on either side of the trigger point.

It may thus be seen there has been shown and described an arrangement for overcoming the problems of the prior art wherein a simple and effective method is provided of keeping an operator continuously aware of incoming information where a REFRESH mode of operation is employed in a digital storage oscilloscope so that before the system is ready to display information following a trigger event, information gathered immediately preceding the trigger event is displayed in the display system in a ROLL mode of operation. This is particularly of advantage where slow time base rates are employed. Although this system has particular application to digital storage oscilloscopes it has application to any other graphic display wherein data is acquired and displayed at slow rates for example displays of information gathered from medical instrumentation or computer simulations of digital or analog signals.

It will be appreciated that not all the control functions necessary for ROLL and REFRESH modes have been disclosed. This is because the undescribed functions are conventional and known to those skilled in the art.

The present invention can be implemented wholly in hardware, wholly in software or partly in software, partly in hardware, the choice of implementation depending on the required speed of operation. At the present moment high data rates require at least a part of the tasks to be carried out in hardware with slower data rates or data processing being carried out in software. The balance betwen hardware and software may change in the future.

I claim:

1. A method of displaying data on a display screen on either side of a trigger point upon occurrence of a trigger event, comprising the steps of:
   displaying new data as the new data is acquired at the trigger point and rolling old data toward and off a first end of the display screen;
   detecting the trigger event;
   freezing the data being displayed on the display screen between the trigger point and the first end; and
   displaying post-trigger event data continuously from the trigger point toward and to a second end of the display screen as the post-trigger event data is acquired.

2. An apparatus for displaying data on a display screen having first and second ends and a trigger point therebetween, comprising:
   acquisition means for acquiring data to be displayed on the display screen;
   memory means for storing the data acquired by said acquisition means;
   addressing means, operatively connected to said memory means and the display screen, for controlling the displaying of the data stored in said memory means on the display screen before a trigger event so that data newly acquired by said acquisition means and stored in said memory means is displayed at the trigger point as it becomes available and data previously acquired and displayed is rolled toward the first end of the display screen; and
   arresting means for arresting the rolling of the displayed data toward the first end a predetermined time after an occurrence of the trigger event and displaying post-trigger data sequentially and continuously between the trigger point and the second end of the display screen as the post-trigger data is acquired.

3. An apparatus as claimed in claim 2, further comprising:
   pre-trigger acquisition buffer means connected to said memory means for receiving data acquired prior to the trigger event;
   post-trigger acquisition buffer means connected to said memory means for receiving data acquired after the trigger event; and
   trigger control means for enablng the post-trigger acquisition buffer means and disabling the pre-trigger acquisition buffer means in response to a trigger signal generated by the trigger event.

4. An apparatus as claimed in claim 3, wherein operation of the trigger control means is inhibited until the pre-trigger acquisition buffer means has acquired a predetermined amount of data.

5. An apparatus as claimed in claim 4, further comprising pre-trigger counter means for counting the data acquired by the pre-trigger acquisition buffer means and providing an overflow signal to enable the trigger control means when the predetermined amount of data has been acquired.

6. An apparatus as claimed in claim 3, further comprising write counter means for counting data acquired by the post-trigger acquisition buffer means and ending the acquisition of data in said post-trigger acquisition means after counting a predetermined amount of data.

* * * * *